US011775269B2

(12) United States Patent
Pelton et al.

(10) Patent No.: US 11,775,269 B2
(45) Date of Patent: *Oct. 3, 2023

(54) GENERATING A SYNCHRONOUS DIGITAL CIRCUIT FROM A SOURCE CODE CONSTRUCT DEFINING A FUNCTION CALL

(71) Applicant: MICROSOFT TECHNOLOGY LICENSING, LLC, Redmond, WA (US)

(72) Inventors: Blake D. Pelton, Redmond, WA (US); Adrian Michael Caulfield, Woodinville, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/592,489

(22) Filed: Feb. 3, 2022

(65) Prior Publication Data

US 2022/0156050 A1    May 19, 2022

Related U.S. Application Data

(63) Continuation of application No. 16/247,181, filed on Jan. 14, 2019, now Pat. No. 11,275,568.

(51) Int. Cl.
*G06F 30/34* (2020.01)
*G06F 8/41* (2018.01)
*G06F 8/30* (2018.01)

(52) U.S. Cl.
CPC ............ *G06F 8/41* (2013.01); *G06F 8/314* (2013.01); *G06F 30/34* (2020.01)

(58) Field of Classification Search
CPC .. G06F 13/16; G06F 13/4068; G06F 13/4265; G06F 9/52; G06F 12/08;
(Continued)

(56) References Cited

U.S. PATENT DOCUMENTS 7,315,991 B1 * 1/2008 Bennett ................. G06F 30/30
716/106
11,144,286 B2 * 10/2021 Pelton ................... G06F 8/314
(Continued)

OTHER PUBLICATIONS

"Office Action Issued in European Patent Application No. 20702950.5", dated Apr. 19, 2022, 5 Pages.
(Continued)

*Primary Examiner* — Binh C Tat
(74) *Attorney, Agent, or Firm* — David W. Foster; Newport IP, LLC

(57) ABSTRACT

A multi-threaded imperative programming language includes a language construct defining a function call. A circuit implementation for the construct includes a first pipeline, a second pipeline, and a third pipeline. The first hardware pipeline outputs variables to a first queue and outputs parameters for the function to a second queue. The second hardware pipeline obtains the function parameters from the second queue, performs the function, and stores the results of the function in a third queue. The third hardware pipeline retrieves the results generated by the second pipeline from the second queue and retrieves the variables from the first queue. The third hardware pipeline performs hardware operations specified by the source code using the variables and the results of the function. A single instance of the circuit implementation can be utilized to implement calls to the same function made from multiple locations within source code.

20 Claims, 7 Drawing Sheets

(58) Field of Classification Search
CPC .............. G06F 12/0862; G06F 12/0875; G06F 8/4452; G06F 30/30; G06F 12/0895; G06F 15/17381; G06F 2115/10; G06F 2212/455; G06F 2212/6026; G06F 30/392; G06F 8/40; G06F 8/452; G06F 30/327; G06F 8/41; G06F 30/34; G06F 9/3867; G06F 1/12; G06F 3/014; G06F 3/017; G06F 30/398; G06F 8/43; G06F 11/3628; G06F 11/3648; G06F 30/331; G06F 8/314; G06F 9/48; G06F 9/5027; G06F 9/546; G06F 1/163; G06F 12/0802; G06F 12/0804; G06F 12/0806; G06F 12/0811; G06F 12/0815; G06F 12/0848; G06F 12/0864; G06F 12/1036; G06F 12/123; G06F 16/245; G06F 16/2455; G06F 16/33; G06F 16/9017; G06F 2117/08; G06F 2200/1636; G06F 2203/0331; G06F 2203/0337; G06F 2203/0339; G06F 2203/0382; G06F 2203/0384; G06F 2212/1016; G06F 2212/1028; G06F 2212/451; G06F 2212/502; G06F 2212/6022; G06F 2212/6032; G06F 2212/683; G06F 2212/684; G06F 3/016; G06F 3/0236; G06F 3/03547; G06F 3/038; G06F 3/0383; G06F 30/32; G06F 30/323; G06F 30/343; G06F 7/14; G06F 8/34; G06F 8/427; G06F 8/443; G06F 9/38; G06F 9/3834; G06F 9/3838; G06F 9/3851; G06F 9/3869; G06F 9/3871; G06F 9/3895; G06F 1/3275; G06F 1/329; G06F 1/3296; G06F 11/073; G06F 11/076; G06F 11/0787; G06F 11/2005; G06F 11/2007; G06F 11/3013; G06F 11/3037; G06F 11/3055; G06F 11/3093; G06F 11/3452; G06F 13/4022; G06F 13/409; G06F 13/4221; G06F 16/2465; G06F 21/64; G06F 21/78; G06F 2213/0026; G06F 2216/03; G06F 15/76; G06F 15/7867; G06F 15/80; G06F 15/8023; G06F 18/217; G06F 18/285; G06F 1/3209; G06F 1/3228; G06F 1/3243; G06F 11/3433; G06F 11/3495; G06F 21/51; G06F 21/57; G06F 21/577; G06F 2201/875; G06F 2209/503; G06F 2221/033; G06F 2221/2135; G06F 9/3875; G06F 9/44505; G06F 9/547; H01L 2027/11838; H01L 23/528; H01L 27/0207

USPC .................................................. 716/110–117

See application file for complete search history.

(56) References Cited

U.S. PATENT DOCUMENTS 11,275,568 B2 * 3/2022 Pelton .................... G06F 30/34
2013/0125097 A1 * 5/2013 Ebcioglu .................. G06F 8/40
717/136

OTHER PUBLICATIONS

U.S. Appl. No. 11,106,437, filed Aug. 31, 2021.
U.S. Appl. No. 11,113,176, filed Sep. 7, 2021.
U.S. Appl. No. 10,810,343, filed Oct. 20, 2020.
U.S. Appl. No. 11,144,286, filed Oct. 12, 2021.
U.S. Appl. No. 11/093,682, filed Aug. 17, 2021.
"Notice of Acceptance Issued in South Africa Patent Application No. 2021/03821", dated Jun. 13, 2022, 1 Page.
"Office Action Issued in European Patent Application No. 20702950.5", dated Sep. 8, 2022, 5 Pages.
"Office Action Issued in Indian Patent Application No. 202147029806", dated Jan. 24, 2023, 8 Pages.
"Office Action Issued in Indian Patent Application No. 202147029889", dated Feb. 17, 2023, 6 Pages.
"Office Action Issued in Indian Patent Application No. 202147029698", dated Feb. 22, 2023, 6 Pages.
"Notice of Allowance Issued in European Patent Application No. 19848854.6", dated Apr. 4, 2023, 8 Pages.
"Office Action Issued in Russian Patent Application No. 2021/124,047", dated Apr. 21, 2023, 13 Pages.
"Written Opinion Issued in Singapore Patent Application No. 11202107262R", dated May 22, 2023, 8 Pages.
"Office Action Issued in Indonesian Patent Application No. P00202105185", dated Jun. 22, 2023, 4 Pages.
"Decision to Grant Issued in European Patent Application No. 19848854.6", dated Aug. 3, 2023, 2 Pages.
"Office Action Issued in European Patent Application No. 19848855.3", dated Aug. 7, 2023, 6 Pages.

* cited by examiner

GENERATING A SYNCHRONOUS DIGITAL CIRCUIT FROM A SOURCE CODE CONSTRUCT DEFINING A FUNCTION CALL

PRIORITY APPLICATION

This application claims the benefit of and priority to U.S. patent application Ser. No. 16/247,181 filed Jan. 14, 2019, the entire contents of which are incorporated herein by reference.

BACKGROUND

Hardware description languages ("HDLs") are modeling languages used by hardware engineers to describe the structure and behavior of electronic circuits, most commonly digital logic circuits. Examples of HDLs include Very High Speed Integrated Circuit ("VHSIC") HDL and VERILOG.

HDLs commonly require many lines of code to model digital logic circuits. Even for hardware engineers that are very familiar with HDLs, creation of such code can be extremely time consuming. Moreover, the more lines of code present in a design, the more likely it is for the design to include errors or perform poorly.

Additionally, because HDLs typically utilize a different programming paradigm than imperative programming languages, software engineers that are not intimately familiar with HDLs commonly have a very difficult time utilizing these languages. As a result, electronic circuits generated from HDL created by software engineers can also include errors or perform poorly.

C to HDL tools exist that can convert C-language or C-like program code into HDLs, like VHSIC or VERILOG. There are, however, certain types of programming language constructs that these tools inefficiently implement in hardware. For example, these tools typically create multiple instances of the same hardware when implementing a function that is called from multiple locations in program source code. This results in the inefficient use of limited hardware resources and can result in poor performance.

It is with respect to these and other technical challenges that the disclosure made herein is presented.

SUMMARY

Technologies are disclosed for generating a synchronous digital circuit ("SDC") from a source code construct defining a function call. Through implementations of the disclosed technologies, a SDC can be generated that includes a single instance of hardware for implementing a function called from multiple locations in program source code. This results in more efficient utilization of available hardware, such as when the SDC is implemented in a field-programmable gate array ("FPGA"), as compared to C to HDL tools. Other technical benefits not specifically mentioned herein can also be realized through implementations of the disclosed subject matter.

In order to realize the technical benefits mentioned briefly above, program source code is generated in a multi-threaded imperative programming language and stored. The programming language is imperative in that program statements are executed one after another, and multi-threaded in that multiple threads of execution can be executing in parallel. A thread refers to a collection of local variables that are executed as the local variables are processed by a hardware circuit.

The multi-threaded imperative programming language includes language constructs (or "constructs") that map to circuit implementations. A language construct is a syntactically allowable part of a program that may be formed from one or more lexical tokens. The circuit implementations can be implemented as a SDC in a FPGA, a Gate Array, an Application-Specific Integrated Circuit ("ASIC"), or another type of suitable device. Another hardware component, such as a network interface card ("NIC"), can be configured with the FPGA, gate array, or ASIC, in order to implement desired functionality.

In one configuration, the multi-threaded imperative programming language includes a language construct that defines a function call (which might be referred to herein as a "function call construct"). This construct maps to a circuit implementation for implementing the function call in hardware. The construct can identify the function call and one or more input parameters for the function (referred to herein as "function parameters"). The same construct can be utilized to enable a called function to call other functions.

The circuit implementation corresponding to the function call construct includes a first hardware pipeline. The first hardware pipeline can implement statements located before the function call in the program source code. The first hardware pipeline outputs variables to a first queue and outputs parameters for the function (which might be referred to herein as "function parameters") to a second queue.

The circuit implementation corresponding to the function call construct also includes a second hardware pipeline that obtains the function parameters from the second queue. The second hardware pipeline also includes hardware for implementing the function itself. For example, the second hardware pipeline might implement the function by performing operations on the function parameters and/or other values. The second hardware pipeline stores results generated by performance of the function in a third queue.

The circuit implementation for the function call construct also includes a third hardware pipeline. The third hardware pipeline implements statements located after the function call in the program source code. The third hardware pipeline can retrieve the results generated by the second pipeline from the second queue. The third hardware pipeline can also retrieve the variables stored by the first hardware pipeline from the first queue. The third hardware pipeline can perform hardware operations specified by the source code using the variables and the results of the function.

In some configurations, the circuit implementation can include hardware for implementing function invocations from multiple locations within program source code. In these configurations, the circuit implementation for the function call can include a fourth hardware pipeline. The fourth hardware pipeline can implement statements located before a second function call in the program source code.

The fourth hardware pipeline outputs second variables to a fourth queue and outputs second function parameters to a fifth queue. In these configurations, the second hardware pipeline (i.e. the pipeline implementing the function) can receive the second function parameters from the fifth queue and perform the specified function using the second function parameters. The second hardware pipeline can then store the results of the function in a sixth queue.

A fifth hardware pipeline can implement statements located after the second function call in the program source code. The fifth hardware pipeline can retrieve the results generated by the second pipeline from the sixth queue. The fifth hardware pipeline can also retrieve the second variables stored by the fourth hardware pipeline in the fourth queue.

The fifth hardware pipeline can then perform operations specified by the source code using the second variables and the results of the performance of the function using the second function parameters. In these configurations, the second hardware pipeline can utilize a hidden parameter to determine whether results are to be stored in the third queue (i.e. for consumption by the third pipeline) or the sixth queue (i.e. for consumption by the fifth pipeline).

Once program source code has been defined that includes a construct that maps to a circuit implementation for a function, the source code, including the construct, can be compiled to generate a circuit description. The circuit description can be expressed using HDL, for instance. The circuit description can, in turn, be used to generate an SDC that includes the circuit implementation. For example, HDL might be utilized to generate an FPGA image or bitstream that includes the circuit implementation defined by the construct. The FPGA image or bitstream can, in turn, be utilized to program an FPGA that includes the circuit implementation.

As discussed briefly above, implementations of the technologies disclosed herein enable more efficient utilization of available hardware when implementing functions as compared to previous solutions such as, for instance, C to HDL tools. Other technical benefits not specifically identified herein can also be realized through implementations of the disclosed technologies.

It should be appreciated that the above-described subject matter can be implemented as a computer-controlled apparatus, a computer-implemented method, a computing device, or as an article of manufacture such as a computer readable medium. These and various other features will be apparent from a reading of the following Detailed Description and a review of the associated drawings.

This Summary is provided to introduce a brief description of some aspects of the disclosed technologies in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DETAILED DESCRIPTION

Figure 1:
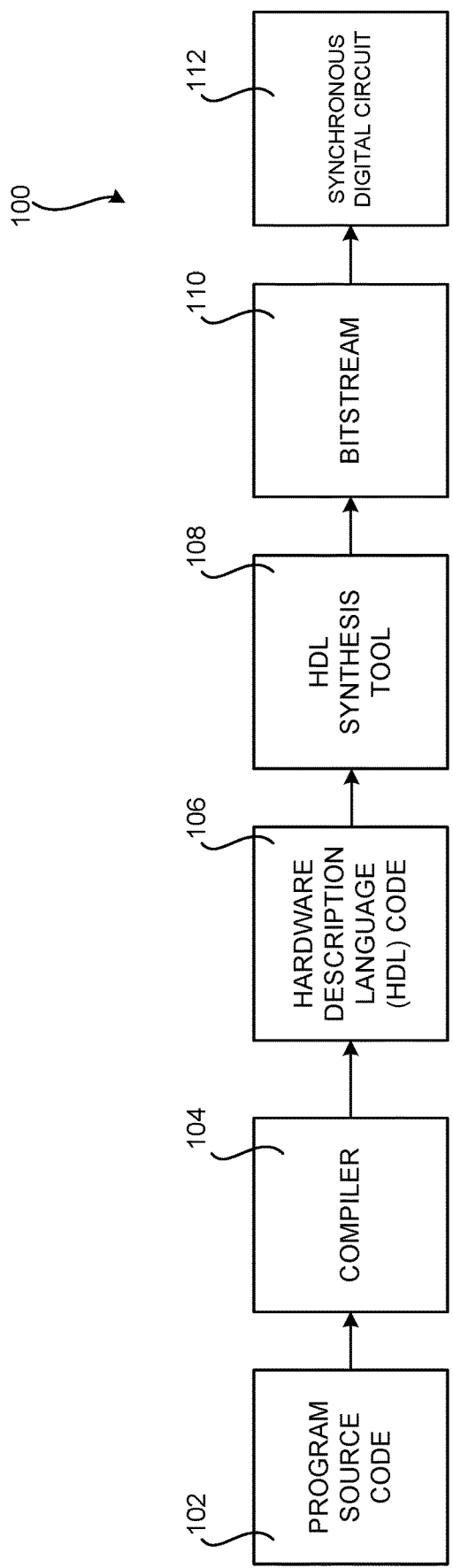
FIG. 1 is a computing architecture diagram that shows aspects of a system disclosed herein for generating a synchronous digital circuit based on program source code that includes a programming construct defining a function call.

The following detailed description is directed to technologies for generating a SDC based on a source code construct that defines a function. As discussed briefly above, implementations of the technologies disclosed herein enable a SDC to be generated that includes a single instance of hardware for implementing a software-defined function that is called from multiple locations in program source code. This results in more efficient utilization of available hardware, such as when the SDC is implemented in a FPGA for instance, as compared to C to HDL tools. Other technical benefits not specifically mentioned herein can also be realized through implementations of the disclosed subject matter.

While the subject matter described herein is presented in the general context of a computing system executing a compiler configured for compiling source code language constructs that map to circuit implementations, those skilled in the art will recognize that other implementations can be performed in combination with other types of computing systems and modules. Those skilled in the art will also appreciate that the subject matter described herein can be practiced with other computer system configurations, including hand-held devices, multiprocessor systems, microprocessor-based or programmable consumer electronics, computing or processing systems embedded in devices (such as wearable computing devices, automobiles, home automation etc.), minicomputers, mainframe computers, and the like.

In the following detailed description, references are made to the accompanying drawings that form a part hereof, and which are shown by way of illustration specific configurations or examples. Referring now to the drawings, in which like numerals represent like elements throughout the several FIGS., aspects of various technologies for generating a SDC from a source code construct that defines a function will be described.

FIG. 1 is a computing architecture diagram that shows aspects of an illustrative system 100 disclosed herein for defining and generating a SDC 112 based on program source code 102 that includes a programming construct defining a function call. As discussed briefly above, SDCs 112 can be implemented by Gate Arrays, FPGAs, ASICs, and other types of circuit devices. While the disclosed subject matter is primarily described in the context of an SDC 112 implemented in an FPGA, it is to be appreciated that the technologies disclosed herein can be utilized to define SDCs 112 that are implemented using other types of devices.

As illustrated in FIG. 1, the illustrative system 100 includes a compiler 104 that compiles program source code 102 to generate hardware description language ("HDL") code 106 or a lower-level representation of a circuit, such as a netlist. As discussed briefly above, HDLs are modeling languages used by hardware engineers to describe the structure and behavior of electronic circuits, most commonly digital logic circuits. Examples of HDLs include VHSIC HDL and VERILOG.

The program source code 102 is expressed using a multi-threaded imperative programming language designed to target SDCs 112. The disclosed language provides many of the features of languages such as 'C' and 'JAVA, such as function calls, for-loops, arithmetic operators, and conditional statements. However, the disclosed language includes constructs that map directly to an underlying SDC 112 hardware implementation. This enables both hardware and software engineers to reason about performance, and to be effective in optimizing their designs. This can also make the language familiar to software engineers, and free hardware engineers from dealing with whole classes of bugs that arise when coding in an HDL.

The disclosed multi-threaded imperative programming language is imperative in that program statements are executed one after another, and multi-threaded in that multiple threads of execution can be executing in parallel. As discussed above, a thread is a collection of variables that are executed as the variables are processed by a hardware circuit.

The threads described herein are analogous to, yet different, from software threads. While a software thread maintains a call stack containing variables and executes code in memory, the threads described herein are collections of variables that move through hardware circuits. While a software thread has a location in executable code determined by an instruction pointer, the disclosed thread has a physical location on the SDC at a given point in time. SDCs may execute hundreds, thousands, or even millions of threads, and SDC execution may be pipelined—i.e. different threads may execute within different stages of a circuit at the same time.

As will be described in greater detail below, language constructs can be defined in the program source code 102 that map to a circuit implementation. A language construct is a syntactically allowable part of a program that may be formed from one or more lexical tokens. The language constructs described herein map to circuit implementations that guarantee thread ordering (i.e. that threads will exit a circuit implementation in the same order that they entered).

As will also be described in greater detail below, the circuit implementations generated by the constructs disclosed herein can be implemented as an SDC in an FPGA, a Gate Array, an ASIC, or another type of suitable device. Another hardware component, such as a NIC, can be configured with the FPGA, Gate Array, or ASIC, in order to implement desired functionality.

As shown in FIG. 1, a compiler 104 can compile the program source code 102 including one or more of the language constructs disclosed herein to a circuit description, HDL code 106 in this example. The HDL code 106 can be provided to an HDL synthesis tool 108 which, in turn, can generate a bitstream 110 that can be utilized to generate an SDC 112, such as for instance on an FPGA. When targeting an ASIC, the HDL code 106 can be provided to an ASIC fabricator for production in a factory.

Figure 2:
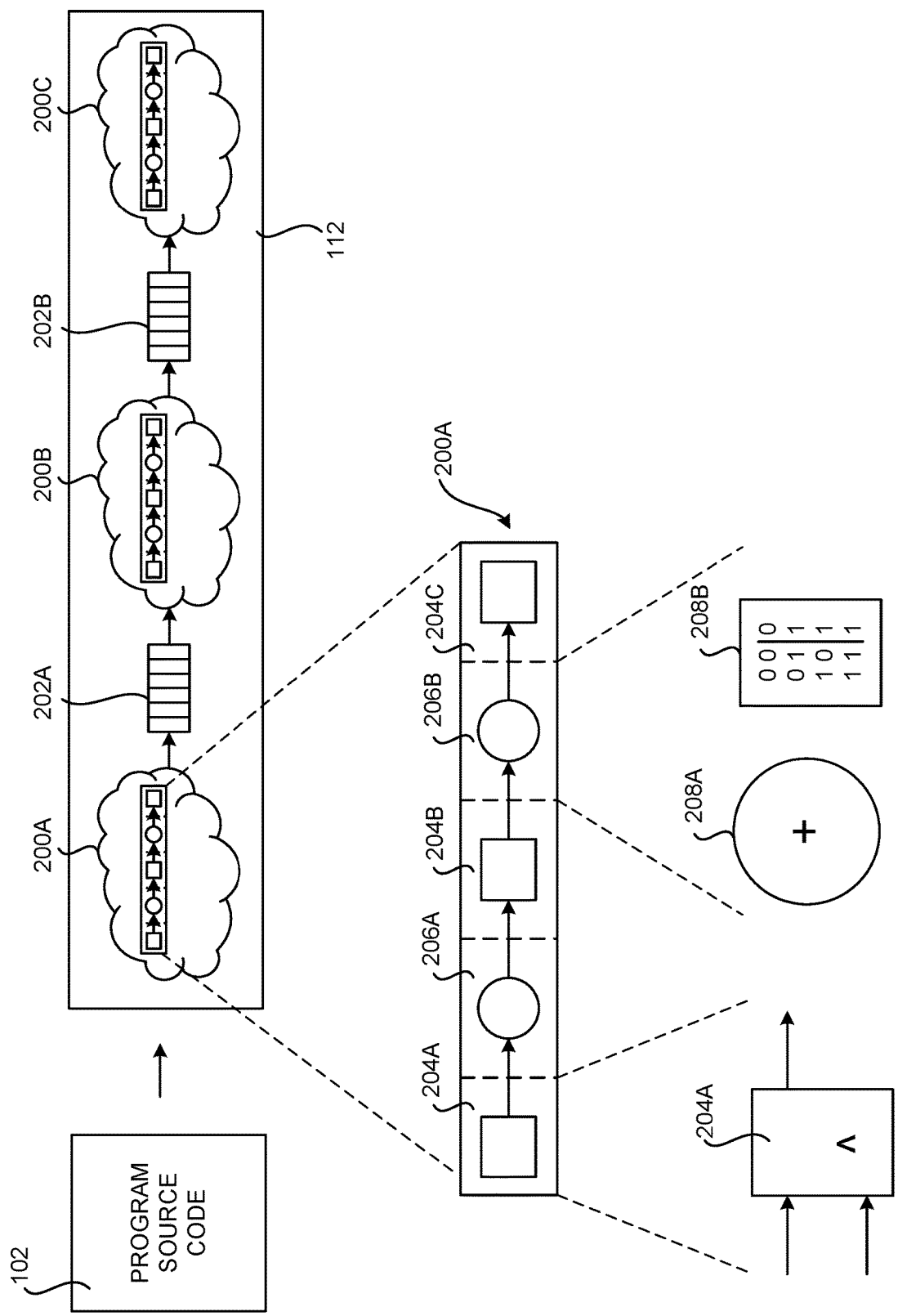
FIG. 2 is a hardware architecture diagram showing aspects of an illustrative example synchronous digital circuit that includes several hardware pipelines, each having multiple pipeline stages, and computational units that can be defined and implemented using the disclosed technologies.

FIG. 2 is a hardware architecture diagram showing aspects of an illustrative example SDC 112 that includes several hardware pipelines 200A-200C (or "pipelines") that can be defined and implemented using the disclosed technologies. Each hardware pipeline has multiple pipeline stages 206, each of which has computational units 208. As shown in FIG. 2, the program source code 102 can be compiled into pipelines 200A-200C of hardware computational units 208.

The pipelines 200A-200C can be connected by first-in-first-out ("FIFO") queues (which might be referred to herein as "FIFOs" or "queues"). The pipelines 200A-200C implement the functionality defined by the program source code 102. The FIFOs 202 store data values, providing input to pipelines 200 as well as storing output generated by pipelines 200. For example, the SDC 112 includes a pipeline 200A that feeds its output to the FIFO 202A. Pipeline 200B, in turn, obtains its input from the FIFO 202A and provides its output to the FIFO 202B. The pipeline 200C obtains its input from the FIFO 202B.

In some configurations, the pipelines 200 implement circuitry that determines when to retrieve the next value(s) from a FIFO 202. For example, a policy may require that an input FIFO (e.g. the FIFO 202A in the case of the pipeline 200B) is not empty and an output FIFO (e.g. the FIFO 202B) is not full before retrieving a value from the input FIFO (e.g. the FIFO 202A) for processing.

As shown in FIG. 2, a pipeline 200 may consist of one or more pipeline stages 206A-206B. Execution is pipelined by executing different threads in different stages 206 of a pipeline 200 concurrently. The results of stages can be stored in registers 204 and provided to the next stage 206 for the duration of the next clock cycle.

Each pipeline stage 206 can include one or more computational units 208, such as adder 208A and lookup table ("LUT") 208B. In the illustrated example, adder 208A can perform basic arithmetic, e.g. addition, subtraction, or multiplication. Computational units can also implement Boolean operators (e.g. "OR", "NOR", "XOR", etc.) or other custom logic provided by the SDC manufacturer.

Computational units can also be implemented by user-programmable lookup tables 208B. The illustrated LUT 208B depicts a two-input truth table that maps two input bits to a single output bit. LUTs 208B can be configured to support different numbers of input bits. To generate more complex output values, e.g. characters or 8-bit integers, multiple LUTs 208B, each connected to a different bit of an input variable, may be used.

Computational units can temporarily store results in registers 204 (or "flip-flops"). The contents of such a register can be provided to other computation units in the same or different pipeline 200. Registers 204 can capture a value at an input when a connected digital clock transitions from 0 to 1, and provide that value at an output until the end of the next clock cycle (i.e. until the clock transitions from 0 to 1 again). Registers can also include an enable line. If an enable line is set to false, then the register will not perform the operations described above, maintaining the current output value over multiple clock cycles.

It is to be appreciated that the pipeline architecture shown in FIG. 2 has been simplified for discussion purposes. The programming language constructs described herein can be utilized to implement much more complex SDCs 112 that include many more components than illustrated in FIG. 2.

Figure 3A:
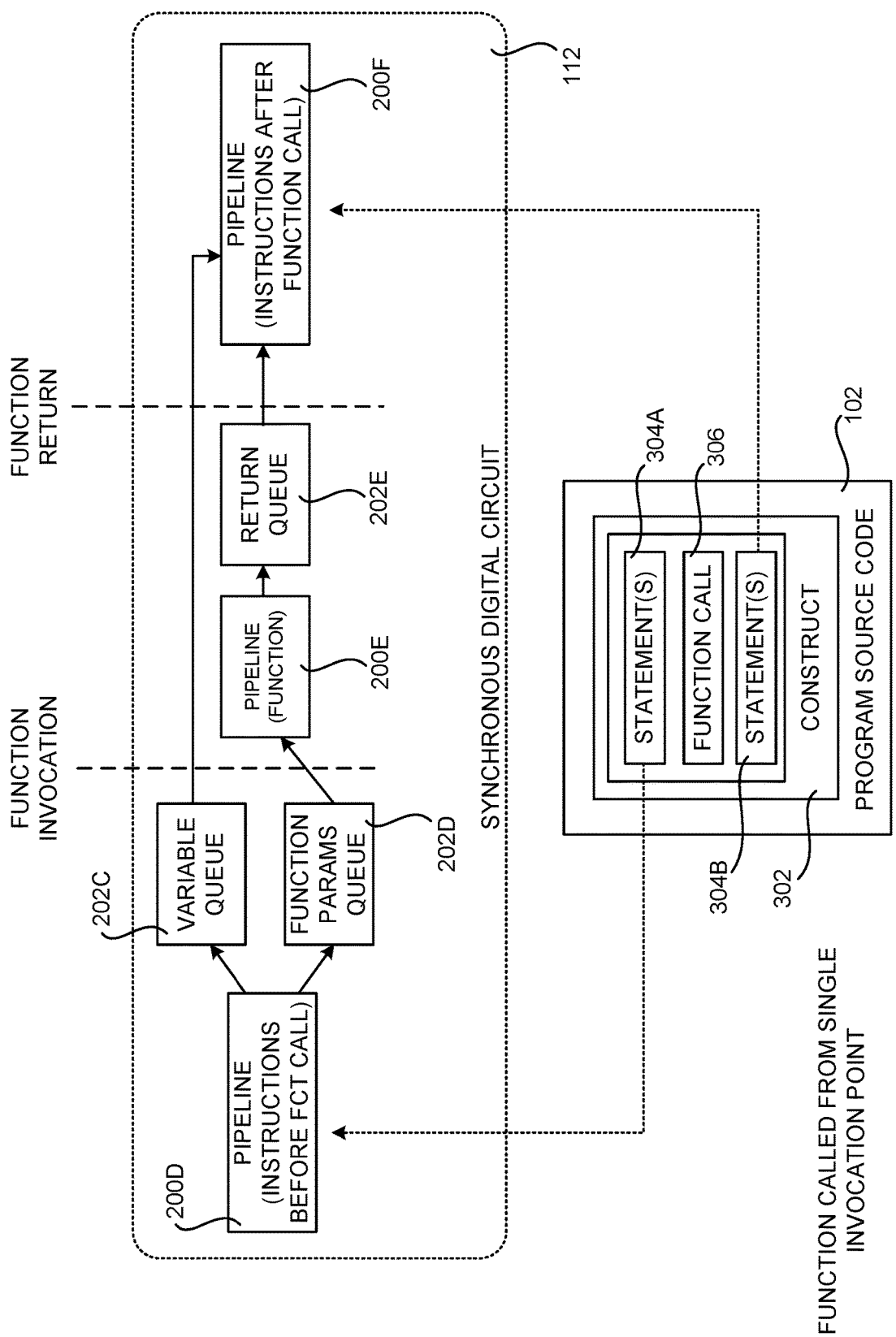
FIG. 3A is a hardware architecture diagram that shows aspects of an illustrative synchronous digital circuit generated from a source code that includes a language construct that defines a function call.

FIG. 3A is a hardware architecture diagram that shows aspects of an illustrative SDC 112 generated from program source code 102 in a multi-threaded imperative programming language that includes a language construct 302 that defines a function call 306. The construct 302 maps to a circuit implementation for implementing the function call 306 in hardware such as, for instance, the illustrative SDC 112 shown in FIG. 3A.

The construct 302 identifies the function call 306 and one or more input parameters for the function (referred to herein as "function parameters"). For example, in the source code sample shown in Table A, a function call 306 has been defined as "Z=G(X)", where X is the input parameter for the function "G."

TABLE A

```
Void F ( ) {
    Int X = 1
    Int Y = 2
    Z = G (X)
    Return Y*Z }
```

As shown in FIG. 3A, the construct 302 also includes statements 304A that are located before the function call 306 in the program source code 102 and statements 304B that are located after the function call 306 in the program source code 102. In the source code sample shown in Table A, the statements "Int X=1" and "Int Y=2" are located before the function call 306 and the statement "Return Y*Z" is located after the function call 306. Other statements can be located prior to or after the function call 306. In this regard, it is to be appreciated that the construct 302 shown in Table A is merely illustrative and that the construct 302 can utilize a different syntax in other configurations.

The construct 302 maps to a circuit implementation that includes a first pipeline 200D, a second pipeline 200E, and a third pipeline 200F. The first hardware pipeline 200D can implement the statements 304A located before the function call 306 in the program source code 102. The first hardware pipeline 200D outputs variables to a variable queue 202C (which might be referred to herein as the "first queue" and outputs parameters for the function to a function parameters queue (which might be referred to herein as the "second queue").

Variables stored in a variable queue 202 are variables that have a value prior to a function call 306 and that are used after the function call 306. In the sample source code shown in Table A, the variable "Y" will be stored in a variable queue since it has a value prior to the function call 306 and is used after the function call in the statement "Return Y*Z." The variable "X" is not stored in a variable queue since it is not utilized after the function call 306.

The second hardware pipeline 200E in the circuit implementation corresponding to the function call construct 302 obtains function parameters from the function parameters queue 202D. The second hardware pipeline 200E also includes hardware for implementing the function itself. For example, the second hardware pipeline 200E might implement the function by performing operations on the function parameters and/or other values. In the sample source code shown in Table A, the function is "G()", which takes one parameter, "X." The second hardware pipeline 200E stores results generated by performance of the function in a return queue 202E (which might be referred to herein as the "third queue").

The third hardware pipeline 200F in the circuit implementation for the function call construct 302 implements the statements 304B located after the function call 302 in the program source code 102. The third hardware pipeline 200F can retrieve the results generated by the second pipeline 200E from the return queue 202E. The third hardware pipeline 200F can also retrieve the variables stored in the variable queue 202C by the first hardware pipeline 200D. The third hardware pipeline 200F can perform hardware operations specified by the statements 304B using the variables and the results of the function. In the sample source code shown in Table A, the third pipeline 200F implements "Return Y*Z." As discussed above, Y is pushed on the variable queue 202C by the pipeline 200D and Z is the result of the function "G(X)" pushed on the return queue 202E by the second pipeline 200E.

Figure 3B:
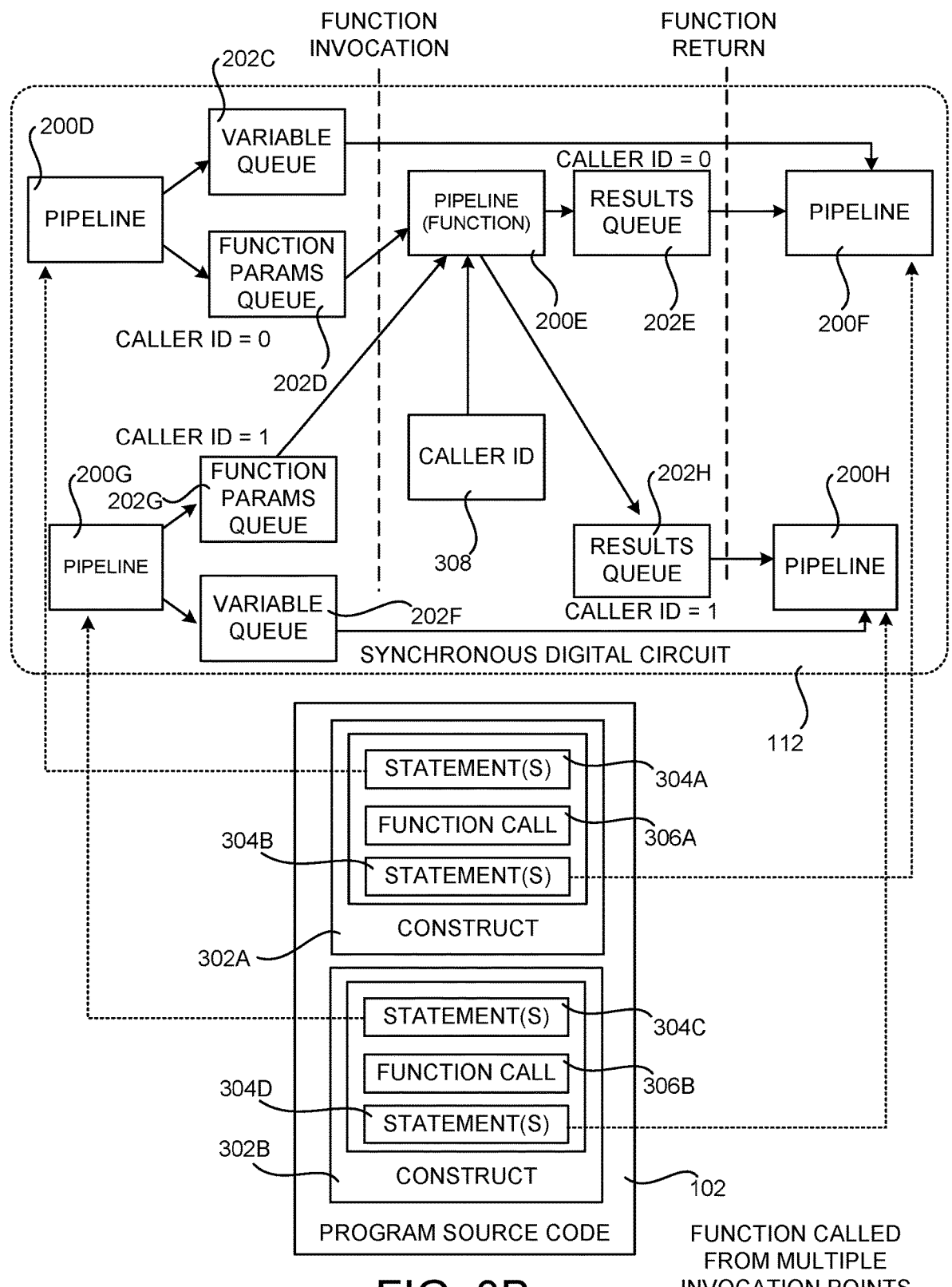
FIG. 3B is a hardware architecture diagram that shows aspects of an illustrative synchronous digital circuit generated from source code that includes a language construct that defines a function that is called from multiple locations within source code.

In the example shown in FIG. 3A, the function defined by the construct 302 is called from only a single location (i.e. the function call 306). It is possible, however, for calls to be made to a function from multiple locations within the program source code 102. FIG. 3B shows aspects of an illustrative SDC 112 generated from program source code 102 that includes a language construct 302 that defines a function that is called from multiple locations within the source code 102. The SDC 112 shown in FIG. 3B includes a single instance of hardware for implementing a function called from multiple locations in program source code 102.

As shown in FIG. 3B, the program source code 102 includes the statements 304A, the function call 306A, and the statements 304B as in the example shown in FIG. 3A and described above. The program source code 102 in the example shown in FIG. 3B also includes a second function call 306B to the same function as the function call 306A. The program source code also includes statements 304C located prior to the function call 306B and statements 304D located after the function call 306B in the program source code 102.

In order to implement the function call 306B, the SDC 112 includes a fourth hardware pipeline 200G. The fourth hardware pipeline 200G can implement the statements 304C located before the second function call 306B in the program source code 102.

The fourth hardware pipeline 200G outputs second variables to a second variable queue 202F (which might be referred to herein as the "fourth queue") and outputs second function parameters to a second function parameters queue 202G (which might be referred to herein as the "fifth queue.") In these configurations, the second hardware pipeline 200E (i.e. the pipeline implementing the function) can obtain the second function parameters from the second function parameters queue 202G and perform the specified function using the second function parameters. The second hardware pipeline 200E can then store the results of the function in a second results queue 202H (which might be referred to herein as the "sixth queue").

As shown in FIG. 3B, a fifth hardware pipeline 200H can implement the statements 304D located after the second function call 306B in the program source code 102. The fifth hardware pipeline 200H can retrieve the results generated by the second pipeline 200E from the second results queue 202H. The fifth hardware pipeline 200H can also retrieve the second variables stored by the fourth hardware pipeline 200G in the second variable queue 202F. The fifth hardware pipeline 200H can then perform operations specified by the program source code 102 using the second variables and the results of the function using the second function parameters.

In the configuration shown in FIG. 3B, the second hardware pipeline 200E can utilize a hidden parameter (i.e. a parameter that is not exposed to the programmer of the source code 102) to determine whether results are to be stored in the results queue 202E (i.e. for consumption by the third pipeline 200F) or the results queue 202H (i.e. for consumption by the fifth pipeline). The compiler 104 can automatically generate a circuit description for implementing the hidden parameter in the SDC 112.

In the example shown in FIG. 3B, the hidden parameter is shown as the "Caller ID." When the Caller ID=0, the pipeline 200E stores its results in the results queue 202E. When the Caller ID=1, the pipeline 200E stores its results in the results queue 202H.

Figure 4:
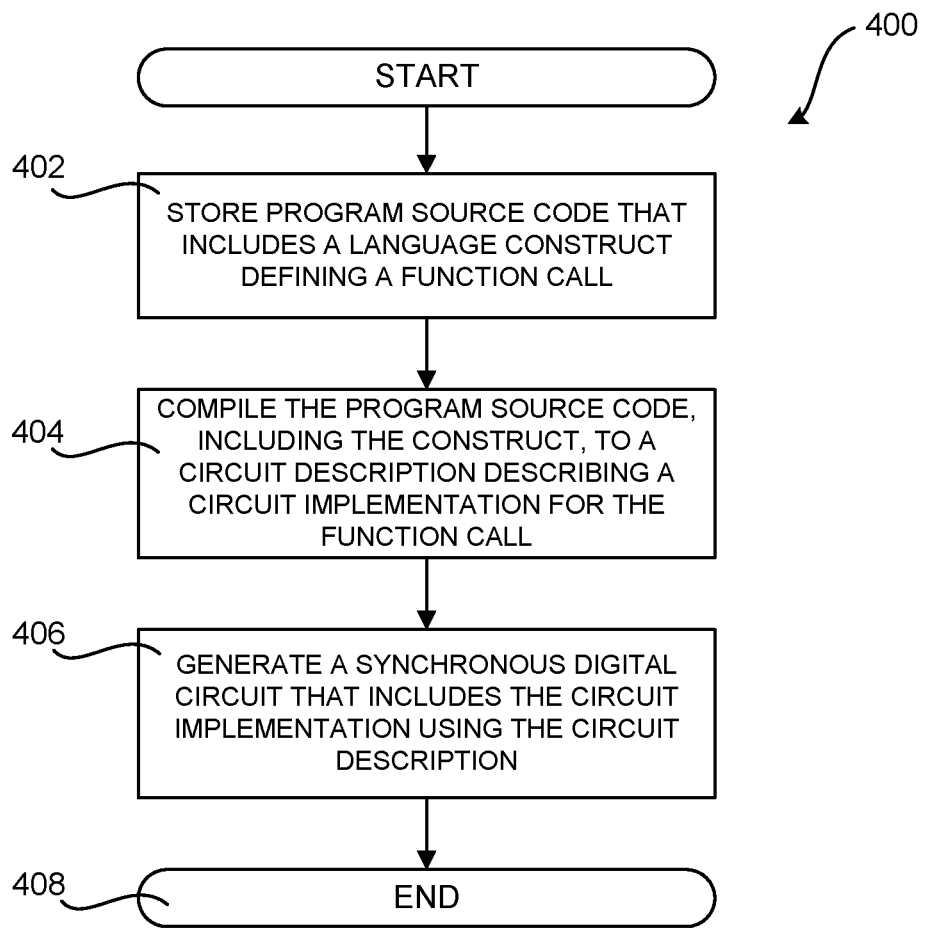
FIG. 4 is a flow diagram showing a routine that illustrates aspects of the operation of the technologies described with reference to FIGS. 1-3B for generating a synchronous digital circuit from source code that includes a language construct that defines a function call.

FIG. 4 is a flow diagram showing a routine 400 that illustrates aspects of the operation of the technologies described with reference to FIGS. 1-3B for generating a SDC 112 from source code 102 that includes a language construct 302 that defines a function call 306. It should be appreciated that the logical operations described herein with regard to FIG. 4, and the other FIGS., can be implemented (1) as a sequence of computer implemented acts or program modules running on a computing device and/or (2) as interconnected machine logic circuits or circuit modules within a computing device.

The particular implementation of the technologies disclosed herein is a matter of choice dependent on the performance and other requirements of the computing device. Accordingly, the logical operations described herein are referred to variously as states, operations, structural devices, acts, or modules. These states, operations, structural devices, acts and modules can be implemented in hardware, software, firmware, in special-purpose digital logic, and any combination thereof. It should be appreciated that more or fewer operations can be performed than shown in the FIGS. and described herein. These operations can also be performed in a different order than those described herein.

The routine 400 begins at operation 402, where program source code 102 is defined and stored that includes a language construct 302 that defines a function call. From operation 402, the routine 400 proceeds to operation 404, where the compiler 104 compiles the program source code 102 to a circuit description for a SDL 112 for implementing the function call. As discussed above, the circuit description might be expressed as HDL code 106.

From operation 404, the routine 400 proceeds to operation 406, where the circuit description (e.g. HDL code) is utilized to generate an SDC 112 that includes the circuit implementation defined by the circuit description. The routine 400 then proceeds from operation 406 to operation 408, where it ends.

Figure 5:
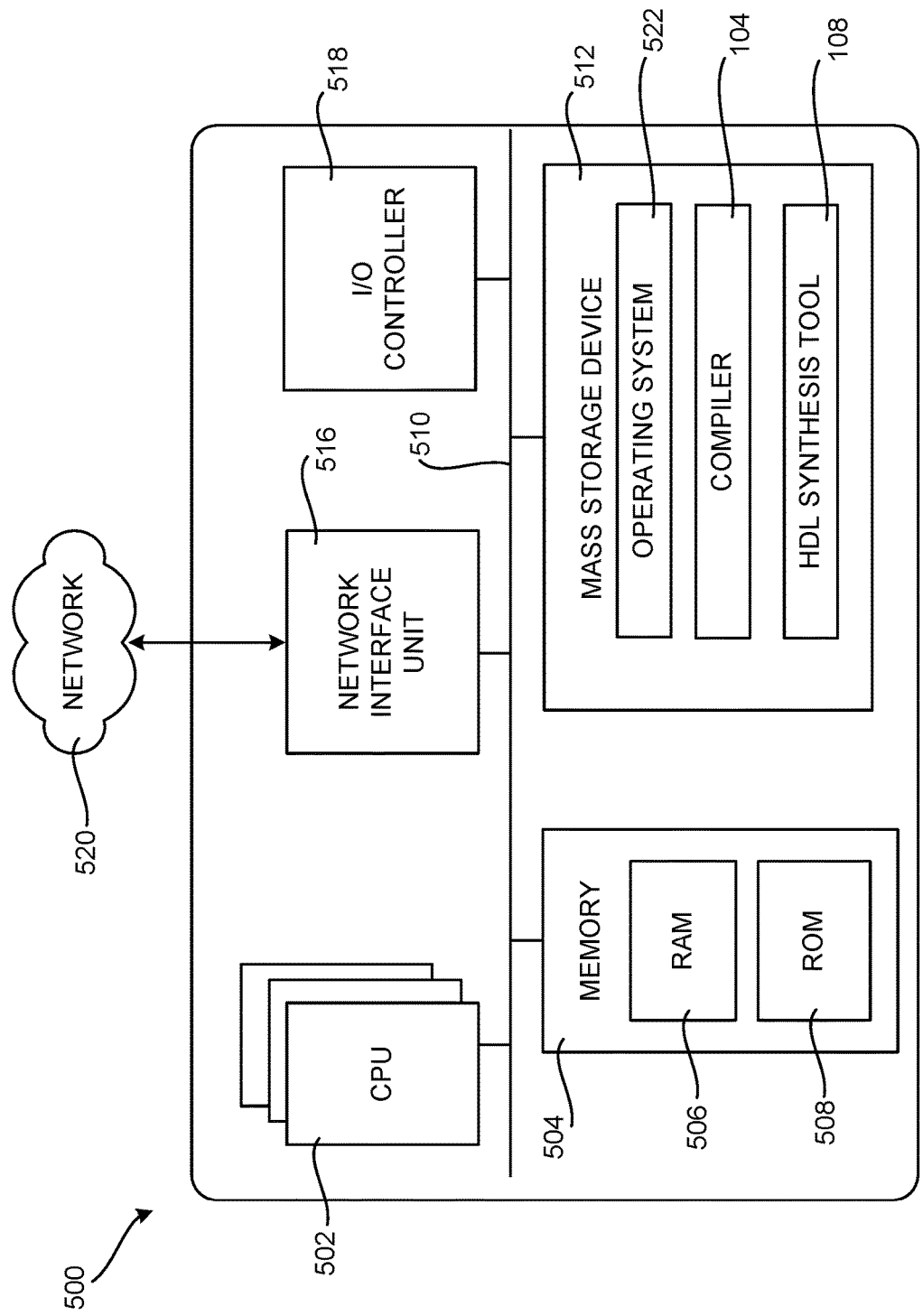
FIG. 5 is a computer architecture diagram showing an illustrative computer hardware and software architecture for a computing device that can implement aspects of the technologies presented herein.

FIG. 5 is a computer architecture diagram showing an illustrative computer hardware and software architecture for a computing device that can implement the various technologies presented herein. In particular, the architecture illustrated in FIG. 5 can be utilized to implement a server computer, mobile phone, an e-reader, a smartphone, a desktop computer, a tablet computer, a laptop computer, or another type of computing device.

The computer 500 illustrated in FIG. 5 includes a central processing unit 502 ("CPU"), a system memory 504, including a random-access memory 506 ("RAM") and a read-only memory ("ROM") 508, and a system bus 510 that couples the memory 504 to the CPU 502. A basic input/output system ("BIOS" or "firmware") containing the basic routines that help to transfer information between elements within the computer 500, such as during startup, can be stored in the ROM 508. The computer 500 further includes a mass storage device 512 for storing an operating system 522, application programs, and other types of programs, such as the compiler 104 and the HDL synthesis tool 108. The mass storage device 512 can also be configured to store other types of programs and data.

The mass storage device 512 is connected to the CPU 502 through a mass storage controller (not shown) connected to the bus 510. The mass storage device 512 and its associated computer readable media provide non-volatile storage for the computer 500. Although the description of computer readable media contained herein refers to a mass storage device, such as a hard disk, CD-ROM drive, DVD-ROM drive, or USB storage key, it should be appreciated by those skilled in the art that computer readable media can be any available computer storage media or communication media that can be accessed by the computer 500.

Communication media includes computer readable instructions, data structures, program modules, or other data in a modulated data signal such as a carrier wave or other transport mechanism and includes any delivery media. The term "modulated data signal" means a signal that has one or more of its characteristics changed or set in a manner so as to encode information in the signal. By way of example, and not limitation, communication media includes wired media such as a wired network or direct-wired connection, and wireless media such as acoustic, radio frequency, infrared and other wireless media. Combinations of the any of the above should also be included within the scope of computer readable media.

By way of example, and not limitation, computer storage media can include volatile and non-volatile, removable and non-removable media implemented in any method or technology for storage of information such as computer readable instructions, data structures, program modules or other data. For example, computer storage media includes, but is not limited to, RAM, ROM, EPROM, EEPROM, flash memory or other solid-state memory technology, CD-ROM, digital versatile disks ("DVD"), HD-DVD, BLU-RAY, or other optical storage, magnetic cassettes, magnetic tape, magnetic disk storage or other magnetic storage devices, or any other medium that can be used to store the desired information and which can be accessed by the computer 500. For purposes of the claims, the phrase "computer storage medium," and variations thereof, does not include waves or signals per se or communication media.

According to various configurations, the computer 500 can operate in a networked environment using logical connections to remote computers through a network such as the network 520. The computer 500 can connect to the network 520 through a network interface unit 516 connected to the bus 510. It should be appreciated that the network interface unit 516 can also be utilized to connect to other types of networks and remote computer systems. The computer 500 can also include an input/output controller 518 for receiving and processing input from a number of other devices, including a keyboard, mouse, touch input, an electronic stylus (not shown in FIG. 5), or a physical sensor such as a video camera. Similarly, the input/output controller 518 can provide output to a display screen or other type of output device (also not shown in FIG. 5).

It should be appreciated that the software components described herein, when loaded into the CPU 502 and executed, can transform the CPU 502 and the overall computer 500 from a general-purpose computing device into a special-purpose computing device customized to facilitate the functionality presented herein. The CPU 502 can be constructed from any number of transistors or other discrete circuit elements, which can individually or collectively assume any number of states. More specifically, the CPU 502 can operate as a finite-state machine, in response to executable instructions contained within the software modules disclosed herein. These computer-executable instructions can transform the CPU 502 by specifying how the CPU 502 transitions between states, thereby transforming the transistors or other discrete hardware elements constituting the CPU 502.

Encoding the software modules presented herein can also transform the physical structure of the computer readable media presented herein. The specific transformation of physical structure depends on various factors, in different implementations of this description. Examples of such factors include, but are not limited to, the technology used to implement the computer readable media, whether the computer readable media is characterized as primary or secondary storage, and the like. For example, if the computer readable media is implemented as semiconductor-based memory, the software disclosed herein can be encoded on the computer readable media by transforming the physical state of the semiconductor memory. For instance, the software can transform the state of transistors, capacitors, or other discrete circuit elements constituting the semiconductor memory. The software can also transform the physical state of such components in order to store data thereupon.

As another example, the computer readable media disclosed herein can be implemented using magnetic or optical technology. In such implementations, the software presented herein can transform the physical state of magnetic or optical media, when the software is encoded therein. These transformations can include altering the magnetic characteristics of particular locations within given magnetic media. These transformations can also include altering the physical features or characteristics of particular locations within given optical media, to change the optical characteristics of those locations. Other transformations of physical media are possible without departing from the scope and spirit of the present description, with the foregoing examples provided only to facilitate this discussion.

In light of the above, it should be appreciated that many types of physical transformations take place in the computer 500 in order to store and execute the software components presented herein. It also should be appreciated that the architecture shown in FIG. 5 for the computer 500, or a similar architecture, can be utilized to implement other types of computing devices, including hand-held computers, video game devices, embedded computer systems, mobile devices such as smartphones, tablets, and other types of computing devices known to those skilled in the art. It is also contemplated that the computer 500 might not include all of the components shown in FIG. 5, can include other components that are not explicitly shown in FIG. 5, or can utilize an architecture completely different than that shown in FIG. 5.

Figure 6:
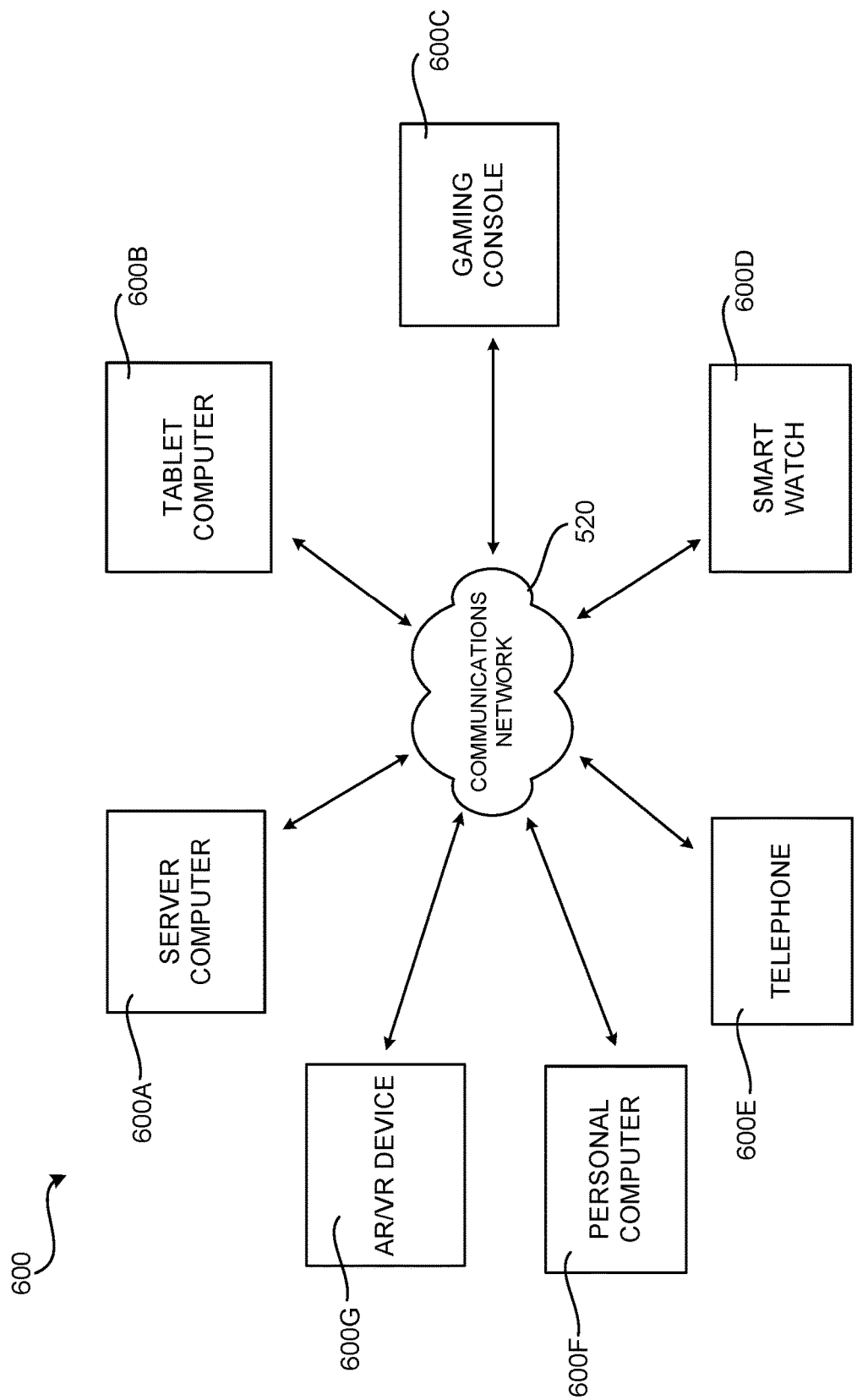
FIG. 6 is a network diagram illustrating a distributed computing environment in which aspects of the disclosed technologies can be implemented.

FIG. 6 is a network diagram illustrating a distributed network computing environment 600 in which aspects of the disclosed technologies can be implemented, according to various embodiments presented herein. As shown in FIG. 6, one or more server computers 600A can be interconnected via a communications network 520 (which may be either of, or a combination of, a fixed-wire or wireless LAN, WAN, intranet, extranet, peer-to-peer network, virtual private network, the Internet, Bluetooth communications network, proprietary low voltage communications network, or other communications network) with a number of client computing devices such as, but not limited to, a tablet computer 600B, a gaming console 600C, a smart watch 600D, a telephone 600E, such as a smartphone, a personal computer 600F, and an AR/VR device 600G.

In a network environment in which the communications network 520 is the Internet, for example, the server computer 600A can be a dedicated server computer operable to process and communicate data to and from the client computing devices 600B-600G via any of a number of known protocols, such as, hypertext transfer protocol ("HTTP"), file transfer protocol ("FTP"), or simple object access protocol ("SOAP"). Additionally, the networked computing environment 600 can utilize various data security protocols such as secured socket layer ("SSL") or pretty good privacy ("PGP"). Each of the client computing devices 600B-600G can be equipped with an operating system operable to support one or more computing applications or terminal sessions such as a web browser (not shown in FIG. 6), or other graphical user interface (not shown in FIG. 6), or a mobile desktop environment (not shown in FIG. 6) to gain access to the server computer 600A.

The server computer 600A can be communicatively coupled to other computing environments (not shown in FIG. 6) and receive data regarding a participating user's interactions/resource network. In an illustrative operation, a user (not shown in FIG. 6) may interact with a computing application running on a client computing device 600B-600G to obtain desired data and/or perform other computing applications.

The data and/or computing applications may be stored on the server 600A, or servers 600A, and communicated to cooperating users through the client computing devices 600B-600G over an exemplary communications network 520. A participating user (not shown in FIG. 6) may request access to specific data and applications housed in whole or in part on the server computer 600A. These data may be communicated between the client computing devices 600B-600G and the server computer 600A for processing and storage.

The server computer 600A can host computing applications, processes and applets for the generation, authentication, encryption, and communication of data and applications, and may cooperate with other server computing environments (not shown in FIG. 6), third party service providers (not shown in FIG. 6), network attached storage ("NAS") and storage area networks ("SAN") to realize application/data transactions.

It should be appreciated that the illustrative computing architecture shown in FIG. 5 and the illustrative distributed network computing environment shown in FIG. 6 have been simplified for ease of discussion. It should also be appreciated that the computing architecture and the distributed computing network can include and utilize many more computing components, devices, software programs, networking devices, and other components not specifically described herein.

The disclosure presented herein also encompasses the subject matter set forth in the following clauses:

Clause 1: A computer-implemented method, comprising: compiling a source code listing to a circuit description, wherein the source code listing includes a function, a call to the function, and statements that execute after the function returns from the call to the function, the circuit description comprising: a first hardware pipeline that implements the call to the function by storing a function parameter in a first queue and storing a local variable in a second queue, a second hardware pipeline that implements the function, wherein the second hardware pipeline receives the function parameter from the first queue, performs an operation using the function parameter, and stores a result in a third queue, and a third hardware pipeline that implements the statements that execute after the function returns from the call to the function, wherein the third hardware pipeline receives the local variable from the second queue and the result from the third queue; and generating, based on the circuit description, a synchronous digital circuit.

Clause 2: The computer-implemented method of Clause 1, wherein the call to the function is one of a plurality of calls to the function, wherein each of the plurality of calls to the function is associated with one of a plurality of sets of statements that executes after the function returns, wherein the circuit description further comprises a plurality of hardware pipelines, each of which implements one of the plurality of sets of statements that execute after the function returns, wherein the circuit description includes a plurality of results queues, one for each of the plurality of hardware pipelines, wherein the first hardware pipeline further implements the call to the function by storing, in the first queue, an identifier of a results queue associated with the third hardware pipeline, wherein the second hardware pipeline receives the identifier of the results queue associated with the third hardware pipeline from the first queue, and wherein the second hardware pipeline determines to store the result in the third queue based on the received identifier.

Clause 3: The computer-implemented method of Clause 2, wherein the function takes one or more parameters, wherein the circuit description is generated from the source code listing by a compiler, and wherein the compiler adds the identifier to the one or more parameters as part of the circuit description that implements the call to the function.

Clause 4: The computer-implemented method of Clause 3, wherein the compiler generates the circuit description of the function to: receive the identifier from the first queue, identify, from the plurality of results queues, the third queue based on the received identifier, and store the result in the third queue based on the identification of the third queue from the plurality of results queue.

Clause 5: The computer-implemented method of Clause 4, wherein storing the result in the third queue based on the received identifier returns execution from the function to the statements that execute after the call to the function.

Clause 6: The computer-implemented method of Clause 1, wherein the first hardware pipeline also implements statements that execute before the call to the function.

Clause 7: The computer-implemented method of Clause 6, wherein the local variable is one of a plurality of local variables available to the statements that execute before the call to the function, and wherein the local variable is selected to be stored in the second queue based on a determination that the local variable is referenced in the statements that execute after the call to the function.

Clause 8: The computer-implemented method of Clause 6, wherein storing the local variable in the second queue and storing the function parameter in the first queue transfers execution from the statements that execute before the call to the function to the function.

Clause 9: The computer-implemented method of Clause 1, wherein the synchronous digital circuit is implemented in a field-programmable gate array (FPGA), a gate array, or application-specific integrated circuit (ASIC).

Clause 10: A synchronous digital circuit generated from a source code listing, wherein the source code listing comprises a function, a plurality of calls to the function, and a plurality of sets of statements that execute after the function returns, the synchronous digital circuit comprising: a second hardware pipeline that implements the function, wherein the second hardware pipeline: receives, from a first queue, an identifier of one of a plurality of result queues, wherein the identifier was stored in the first queue by a first hardware pipeline that implements one of the plurality of calls to the function; performs an operation that generates a result; and stores the result in one of the plurality of result queues based on the identifier; and a third hardware pipeline that implements one of the plurality of sets of statements that execute after the function returns, wherein the third hardware pipeline receives the result from the results queue.

Clause 11: The synchronous digital circuit of Clause 10, wherein the second hardware pipeline remains idle until the first hardware pipeline places the identifier in the first queue.

Clause 12: The synchronous digital circuit of Clause 10, wherein the first hardware pipeline stores a function parameter with the identifier in the first queue, wherein the second hardware pipeline receives the function parameter with the identifier, and wherein the second hardware pipeline performs the operation using the function parameter.

Clause 13: The synchronous digital circuit of Clause 10, wherein a compiler compiles the source code listing into a circuit description of the synchronous digital circuit, wherein the function accepts zero or more function parameters, wherein the compiler generates a circuit description of the second hardware pipeline to accept the identifier as an additional function parameter, and wherein the compiler generates a circuit description of the first hardware pipeline that stores the identifier in the first queue as the additional function parameter.

Clause 14: The synchronous digital circuit of Clause 10, wherein the function accepts one or more parameters, wherein the first hardware pipeline stores values for each of the one or more parameters in the first queue, and wherein the second hardware pipeline receives the values associated with the one or more parameters from the first queue with the identifier.

Clause 15: The synchronous digital circuit of Clause 10, wherein the first hardware pipeline stores one or more local variables in a second queue when calling the function, and wherein the third hardware pipeline receives the one or more local variables from the second queue when receiving the result from the one of the plurality of the result queues.

Clause 16: A computer, comprising: a central processing unit (CPU); and at least one computer storage medium storing a source code listing comprising a function, a call to the function, and statements that execute after the call to the function returns, and instructions, which when executed by the CPU, will cause the CPU to compile the program source code to a circuit description comprising: a first hardware pipeline that implements the call to the function, wherein the first hardware pipeline stores a function parameter in a first queue, and wherein the first hardware pipeline stores, in the first queue, an undeclared function parameter that identifies a third queue that is associated with a third hardware pipeline that implements the statements that execute after the call to the function returns, a second hardware pipeline that implements the function, wherein the second hardware pipeline receives the function parameter and the undeclared function parameter from the first queue, generates a result, determines to store the result in the third queue based on the undeclared function parameter, and stores the result in a third queue, and wherein the third hardware pipeline receives the result from the third queue; and generating, based on the circuit description, a synchronous digital circuit.

Clause 17: The computer of Clause 16, wherein the call to the function is part of a set of statements that execute before the call to the function.

Clause 18: The computer of Clause 17, wherein the set of statements that execute before the call to the function, the call to the function, and the statements that execute after the call to the function returns, are part of a contiguous block of code.

Clause 19: The computer of Clause 18, wherein the first hardware pipeline stores a local variable that will be used by the third hardware pipeline in a second queue, and wherein the third hardware pipeline receives the local variable from the second queue when receiving the result from the third queue.

Clause 20: The computer of Clause 19, wherein the third hardware pipeline continues execution of the contiguous block of code after the call to the function returns.

Based on the foregoing, it should be appreciated that technologies for generating a SDC from a source code construct that defines a function call have been disclosed herein. Although the subject matter presented herein has been described in language specific to computer structural features, methodological and transformative acts, specific computing machinery, and computer readable media, it is to be understood that the subject matter set forth in the appended claims is not necessarily limited to the specific features, acts, or media described herein. Rather, the specific features, acts and mediums are disclosed as example forms of implementing the claimed subject matter.

The subject matter described above is provided by way of illustration only and should not be construed as limiting. Various modifications and changes can be made to the subject matter described herein without following the example configurations and applications illustrated and described, and without departing from the scope of the present disclosure, which is set forth in the following claims.

What is claimed is:

1. A computer-implemented method, comprising:
   compiling a source code listing to a circuit description, wherein the source code listing includes a function, a call to the function of a plurality of calls to the function, and a set of statements that execute after the function returns from the call to the function of a plurality of sets of statements that each execute after the function returns from a corresponding one of the plurality of calls to the function, the circuit description comprising:
   a first hardware pipeline that implements the call to the function by storing a function parameter in a first queue and storing a local variable in a second queue,
   a second hardware pipeline that implements the function, wherein the second hardware pipeline receives the function parameter from the first queue, performs an operation using the function parameter, and stores a result in a third queue, and
   a third hardware pipeline that implements the set of statements that execute after the function returns from the call to the function, wherein the third hardware pipeline receives the local variable from the second queue and the result from the third queue; and
   generating, based on the circuit description, a synchronous digital circuit.

2. The computer-implemented method of claim 1,
   wherein the call to the function is one of a plurality of calls to the function,
   wherein each of the plurality of calls to the function is associated with one of a plurality of sets of statements that executes after the function returns,
   wherein the circuit description further comprises a plurality of hardware pipelines, each of which implements one of the plurality of sets of statements that execute after the function returns,
   wherein the circuit description includes a plurality of results queues, one for each of the plurality of hardware pipelines,
   wherein the first hardware pipeline further implements the call to the function by storing, in the first queue, an identifier of a results queue associated with the third hardware pipeline,
   wherein the second hardware pipeline receives the identifier of the results queue associated with the third hardware pipeline from the first queue, and
   wherein the second hardware pipeline determines to store the result in the third queue based on the received identifier.

3. The computer-implemented method of claim 2, wherein the function takes one or more parameters, wherein the circuit description is generated from the source code listing by a compiler, and wherein the compiler adds the identifier to the one or more parameters as part of the circuit description that implements the call to the function.

4. The computer-implemented method of claim 3, wherein the compiler generates the circuit description of the function to:
   receive the identifier from the first queue,
   identify, from the plurality of results queues, the third queue based on the received identifier, and
   store the result in the third queue based on the identification of the third queue from the plurality of results queue.

5. The computer-implemented method of claim 4, wherein storing the result in the third queue based on the received identifier returns execution from the function to the statements that execute after the call to the function.

6. The computer-implemented method of claim 1, wherein the first hardware pipeline also implements statements that execute before the call to the function.

7. The computer-implemented method of claim 6, wherein the local variable is one of a plurality of local variables available to the statements that execute before the call to the function, and wherein the local variable is selected to be stored in the second queue based on a determination that the local variable is referenced in the statements that execute after the call to the function.

8. The computer-implemented method of claim 6, wherein storing the local variable in the second queue and storing the function parameter in the first queue transfers execution from the statements that execute before the call to the function to the function.

9. The computer-implemented method of claim 1, wherein the synchronous digital circuit is implemented in a field-programmable gate array (FPGA), a gate array, or application-specific integrated circuit (ASIC).

10. A synchronous digital circuit generated from a source code listing, wherein the source code listing comprises a function, a plurality of calls to the function, and a plurality of sets of statements that each execute after the function returns from a corresponding one of the plurality of calls to the function, the synchronous digital circuit comprising:
    a second hardware pipeline that implements the function, wherein the second hardware pipeline:
    receives, from a first queue, an identifier of one of a plurality of result queues, wherein the identifier was stored in the first queue by a first hardware pipeline that implements one of the plurality of calls to the function;
    performs an operation that generates a result; and
    stores the result in one of the plurality of result queues based on the identifier; and a third hardware pipeline that implements one of the plurality of sets of statements that execute after the function returns, wherein the third hardware pipeline receives the result from the results queue.

11. The synchronous digital circuit of claim 10, wherein the second hardware pipeline remains idle until the first hardware pipeline places the identifier in the first queue.

12. The synchronous digital circuit of claim 10, wherein the first hardware pipeline stores a function parameter with the identifier in the first queue, wherein the second hardware pipeline receives the function parameter with the identifier, and wherein the second hardware pipeline performs the operation using the function parameter.

13. The synchronous digital circuit of claim 10, wherein a compiler compiles the source code listing into a circuit description of the synchronous digital circuit, wherein the function accepts zero or more function parameters, wherein the compiler generates a circuit description of the second hardware pipeline to accept the identifier as an additional function parameter, and wherein the compiler generates a circuit description of the first hardware pipeline that stores the identifier in the first queue as the additional function parameter.

14. The synchronous digital circuit of claim 10, wherein the function accepts one or more parameters, wherein the first hardware pipeline stores values for each of the one or more parameters in the first queue, and wherein the second hardware pipeline receives the values associated with the one or more parameters from the first queue with the identifier.

15. The synchronous digital circuit of claim 10, wherein the first hardware pipeline stores one or more local variables in a second queue when calling the function, and wherein the third hardware pipeline receives the one or more local variables from the second queue when receiving the result from the one of the plurality of the result queues.

16. A computer, comprising:
a central processing unit (CPU); and
at least one computer storage medium storing
a source code listing comprising a function, a call to the function of a plurality of calls to the function, and a set of statements that execute after the call to the function returns of a plurality of sets of statements that each execute after the function returns from a corresponding one of the plurality of calls to the function, and
instructions, which when executed by the CPU, will cause the CPU to compile the program source code to a circuit description comprising:
a first hardware pipeline that implements the call to the function, wherein the first hardware pipeline stores a function parameter in a first queue, and wherein the first hardware pipeline stores, in the first queue, an undeclared function parameter that identifies a third queue that is associated with a third hardware pipeline that implements the statements that execute after the call to the function returns,
a second hardware pipeline that implements the function, wherein the second hardware pipeline receives the function parameter and the undeclared function parameter from the first queue, generates a result, determines to store the result in the third queue based on the undeclared function parameter, and stores the result in a third queue, and
wherein the third hardware pipeline receives the result from the third queue; and
generating, based on the circuit description, a synchronous digital circuit.

17. The computer of claim 16, wherein the call to the function is part of a set of statements that execute before the call to the function.

18. The computer of claim 17, wherein the set of statements that execute before the call to the function, the call to the function, and the statements that execute after the call to the function returns, are part of a contiguous block of code.

19. The computer of claim 18, wherein the first hardware pipeline stores a local variable that will be used by the third hardware pipeline in a second queue, and wherein the third hardware pipeline receives the local variable from the second queue when receiving the result from the third queue.

20. The computer of claim 19, wherein the third hardware pipeline continues execution of the contiguous block of code after the call to the function returns.

* * * * *